United States Patent
Lie et al.

(10) Patent No.: US 10,601,628 B2
(45) Date of Patent: Mar. 24, 2020

(54) METHODS AND APPARATUS FOR DYNAMIC ADJUSTMENT OF AMPLIFIER GAIN

(71) Applicant: QUALCOMM Incorporated, San Diego, CA (US)

(72) Inventors: Gregory Lie, Poway, CA (US); Helena Deirdre O'Shea, San Diego, CA (US); Haidong Zhu, San Diego, CA (US); Jason Zhao, San Diego, CA (US); Brian George, San Diego, CA (US); Xiaoling Shen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 178 days.

(21) Appl. No.: 15/979,163

(22) Filed: May 14, 2018

(65) Prior Publication Data

US 2019/0349239 A1 Nov. 14, 2019

(51) Int. Cl.
| | |
|---|---|
| *H04L 27/26* | (2006.01) |
| *H04B 1/403* | (2015.01) |
| *H04W 74/00* | (2009.01) |
| *H03F 3/189* | (2006.01) |
| *H04J 11/00* | (2006.01) |

(52) U.S. Cl.
CPC ......... *H04L 27/2662* (2013.01); *H03F 3/189* (2013.01); *H04B 1/406* (2013.01); *H04W 74/002* (2013.01); *H03F 2200/294* (2013.01); *H03F 2200/451* (2013.01); *H04J 11/00* (2013.01)

(58) Field of Classification Search
CPC ... H03F 3/68; H03F 3/72; H03F 3/189; H03F 3/193; H03F 220/294; H03F 2200/411; H03F 2200/451; H03F 2200/541; H04B 1/30; H04B 1/40; H04B 1/0064; H04B 1/0067; H04B 1/0071; H04B 1/1027; H04L 5/001; H04L 27/2647; H04L 27/2662; H04L 27/3863
See application file for complete search history.

(56) References Cited

U.S. PATENT DOCUMENTS

| | | | |
|---|---|---|---|
| 8,416,870 B2 | 4/2013 | Aytur et al. | |
| 9,362,975 B2 | 6/2016 | Wu et al. | |
| 9,603,097 B2 | 3/2017 | Bhattacharjee et al. | |
| 9,781,644 B2 | 10/2017 | Takano et al. | |
| 9,917,614 B1* | 3/2018 | Kang | H03G 1/0029 |
| 2013/0265892 A1* | 10/2013 | Fernando | H04L 5/001 |
| | | | 370/252 |

(Continued)

*Primary Examiner* — Habte Mered
*Assistant Examiner* — Prince A Mensah
(74) *Attorney, Agent, or Firm* — Arent Fox LLP

(57) ABSTRACT

An aspect of the present disclosure includes methods, systems, and computer-readable media for triggering the single signal during the first buffer period to concurrently adjust a first plurality of gain states of a first plurality of low-noise amplifiers associated with a first expected reception of the first symbol on the first component carrier and a second plurality of gain states of a second plurality of low-noise amplifiers associated with a second expected reception of the second symbol on the second component carrier, and receiving the first symbol via the first component carrier and the second symbol via the second component carrier after the first buffer period.

30 Claims, 9 Drawing Sheets

(56) References Cited

U.S. PATENT DOCUMENTS

| | | | |
|---|---|---|---|
| 2014/0072001 A1* | 3/2014 | Chang | H04B 1/0064 370/542 |
| 2014/0170999 A1* | 6/2014 | Aparin | H03G 3/00 455/132 |
| 2015/0092683 A1 | 4/2015 | Rangarajan et al. | |
| 2015/0098532 A1* | 4/2015 | Ryu | H04L 5/001 375/347 |

* cited by examiner

METHODS AND APPARATUS FOR DYNAMIC ADJUSTMENT OF AMPLIFIER GAIN

BACKGROUND

Aspects of the present disclosure relate generally to wireless communication networks, and more particularly, to apparatus and methods for carrier aggregation (CA).

Wireless communication networks are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, orthogonal frequency-division multiple access (OFDMA) systems, and single-carrier frequency division multiple access (SC-FDMA) systems.

These multiple access technologies have been adopted in various telecommunication standards to provide a common protocol that enables different wireless devices to communicate on a municipal, national, regional, and even global level. For example, a fifth generation (5G) wireless communications technology (which can be referred to as new radio (NR)) is envisaged to expand and support diverse usage scenarios and applications with respect to current mobile network generations. In an aspect, 5G communications technology can include: enhanced mobile broadband addressing human-centric use cases for access to multimedia content, services and data; ultra-reliable-low latency communications (URLLC) with certain specifications for latency and reliability; and massive machine type communications, which can allow a very large number of connected devices and transmission of a relatively low volume of non-delay-sensitive information. As the demand for mobile broadband access continues to increase, however, further improvements in NR communications technology and beyond may be desired.

Devices in a communication network, such as a base station (BS) or a user equipment (UE), may implement CA to increase data throughput. When implementing CA using multiple antennas, however, the varying input power for each component carrier and antenna may require LNA (Low Noise Amplifier) gain adjustment to maximize the signal-to-interference plus noise ratio (SINR) during transmission. To avoid interruptions to data reception/transmission, the gains of the low-noise amplifiers and/or power amplifiers may be adjusted between symbols. Given the number of antennas in typical devices and the limited bandwidth of the radio frequency front end (RFFE) bus, the modem may delay changing the gain of one or more LNAs when there are multiple LNAs which need to be updated. This delay may lead to degradation of data received and/or transmitted. Therefore, improvements in gain adjustment may be desirable.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of the present disclosure include methods, systems, and computer-readable media for determining a first time at which a first symbol is to be received after a first buffer period on a first component carrier, determining a second time at which a second symbol is to be received after a second buffer period on a second component carrier, associating a single signal with a first reception operation of the first component carrier and a second reception operation of the second component carrier in response to the first buffer period substantially overlapping the second buffer period, triggering the single signal during the first buffer period to concurrently adjust a first plurality of gain states of a first plurality of low-noise amplifiers associated with a first expected reception of the first symbol on the first component carrier and a second plurality of gain states of a second plurality of low-noise amplifiers associated with a second expected reception of the second symbol on the second component carrier, and receiving the first symbol via the first component carrier and the second symbol via the second component carrier after the first buffer period.

Aspects of the present disclosure include methods, systems, and computer-readable media for determine a first time at which a first symbol is to be transmitted after a first buffer period on a first component carrier, determine a second time at which a second symbol is to be transmitted after a second buffer period on a second component carrier, associating a single signal with a first reception operation of the first component carrier and a second reception operation of the second component carrier in response to the first buffer period substantially overlapping the second buffer period, triggering the signal during the first buffer period to concurrently adjust a first plurality of gain states of a first plurality of power amplifiers associated with a first expected reception of the first symbol on the first component carrier and a second plurality of gain states of a second plurality of power amplifiers associated with a second expected reception of the second symbol on the second component carrier, and transmitting the first symbol via the first component carrier and the second symbol via the second component carrier after the first buffer period.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
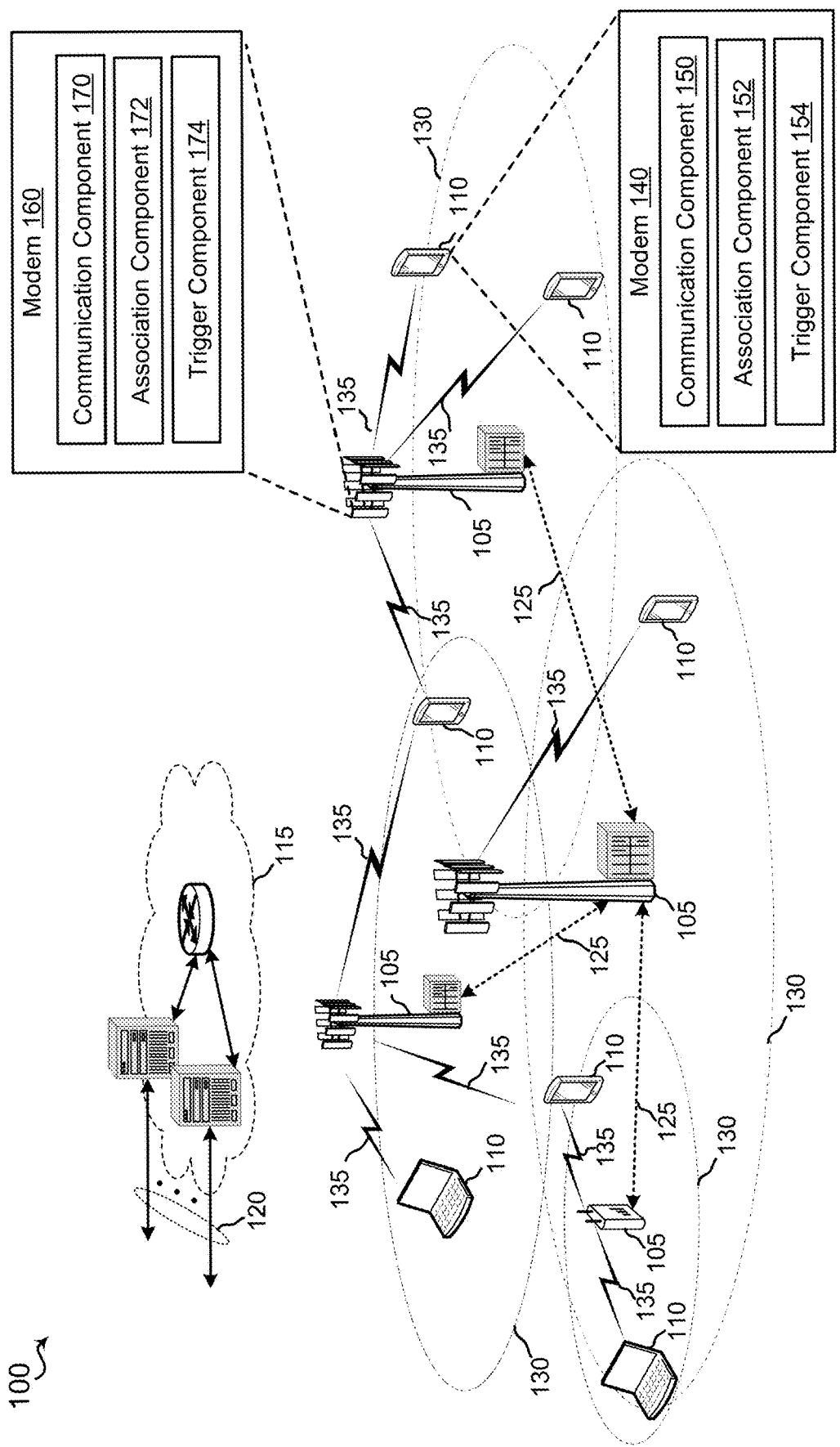
FIG. 1 is a schematic diagram of an example of a wireless communication network including at least one device.

Various aspects are now described with reference to the drawings. In the following description, for purposes of explanation, numerous specific details are set forth in order to provide a thorough understanding of one or more aspects. It may be evident, however, that such aspect(s) may be practiced without these specific details. Additionally, the term "component" as used herein may be one of the parts that make up a system, may be hardware, firmware, and/or software stored on a computer-readable medium, and may be divided into other components.

Various devices may utilize CA to increase the bandwidth, and thereby increase the bitrate. Carrier aggregation can be used for both frequency division duplex (FDD) and time division duplex (TDD). Each carrier may be a component carrier (CC). In certain implementations, a component carrier may have a bandwidth of 1.4, 3, 5, 10, 15 or 20 megahertz. Two or more component carriers may be aggregated. For example, five aggregated component carriers each having a bandwidth of 20 megahertz may have an aggregated bandwidth of 100 megahertz. The number of component carriers in uplink (UL) and downlink (DL) may be the same or different. In certain examples, individual component carriers may have different bandwidths.

During DL at a device, each component carrier may be associated with one or more amplifiers, such as low-noise amplifiers (LNAs). A channel with component carriers may rely on the LNAs to properly receive the data. In some implementations, the LNAs' gain states may require adjusting to optimize the SINR. To avoid adjusting the LNAs' gain states during the receptions of symbols (thus minimizing reception noise), the device may adjust the gain states of the LNAs during buffer periods between the symbols, such as during the cyclic prefixes. Further, the device may dynamically adjust multiple LNAs across various component carriers when the cyclic prefixes of the component carriers overlap.

Similarly, during UL at the device, each component carrier may be associated with one or more amplifiers, such as power amplifiers (PAs). A channel with component carriers may rely on the PAs to properly transmit the data. In some implementations, the PAs' gain states may require adjusting to optimize the SINR. To avoid adjusting the PAs' gain states during the receptions of symbols (thus minimizing transmission noise), the device may adjust the gain states of the PAs during buffer periods between the symbols, such as during the cyclic prefixes. Further, the device may dynamically adjust multiple PAs across various component carriers when the cyclic prefixes of the component carriers overlap.

Reconfigurable triggers, such as RFFE common triggers (CTrig), may handle LNA updates for one or more multiple input, multiple output (MIMO) paths that may be aligned to the same timing of component carrier. For example, an LNA update for a component carrier may allow all 4 diversity/MIMO paths to be updated within the cyclical prefix. The reconfigurable triggers may also be used to dynamically assign reconfigurable triggers to LNAs of different DL carriers as the timing between carriers changes. For example, if the cyclic prefixes of two component carriers overlap, the device may transmit a reconfigurable trigger signal onto the RFFE bus to adjust the gain states of the LNAs of the two component carriers. The dynamic allocation of reconfigurable triggers happens when the LNAs update is necessary. The existing reconfigurable triggers assignments may be reevaluated so that all carriers which share the same timing share the same reconfigurable triggers. This same reassignment happens for PAs that are used for UL CA. As the carriers timing aligns the device may assign the PAs to the same reconfigurable trigger. In some implementations, dynamically assigning a reconfigurable trigger to CCs may cause the gain states of the amplifiers to quickly set to optimal states as RF conditions change, which improves the SINRs of the amplifiers. Further, the dynamic reconfigurable trigger assignment may reduce the cost and complexity of additional RFFE buses for programming multiple carrier amplifiers.

Referring to FIG. 1, in accordance with various aspects of the present disclosure, a wireless communication network 100 includes at least one UE 110 including a modem 140 with a communication component 150 configured to communicate with the other UEs 110 and/or Base station (BS) 105, such as sending/receiving messages to the other UEs 110 and/or BS 105. The modem 140 may further include an association component 152 configured to assign a trigger to a component carrier. The modem 140 may include a trigger component 154 configured to adjust the gains of amplifiers associated with component carriers.

The wireless network may include at least one BS 105 including a modem 160 with a communication component 170 configured to communicate with the UEs 110 and/or other BSs 105, such as sending/receiving messages to the UEs 110 and/or other BSs 105. The modem 160 may further include an association component 172 configured to assign a trigger to a component carrier. The modem 160 may include a trigger component 174 configured to adjust the gains of amplifiers associated with component carriers.

The modem 160 of a base station 105 may be configured to communicate with other base stations 105 and UEs 110 via a cellular network, a Wi-Fi network, or other wireless and wired networks. The modem 140 of a UE 110 may be configured to communicate with the base stations 105 via a cellular network, a Wi-Fi network, or other wireless and wired networks. The modems 140, 160 may receive and transmit data packets.

The wireless communication network 100 may include one or more base stations 105, one or more UEs 110, and a core network 115. The core network 115 may provide user authentication, access authorization, tracking, internet protocol (IP) connectivity, and other access, routing, or mobility functions. The base stations 105 may interface with the core network 115 through backhaul links 120 (e.g., S1, etc.). The base stations 105 may perform radio configuration and scheduling for communication with the UEs 110, or may operate under the control of a base station controller (not shown). In various examples, the base stations 105 may communicate, either directly or indirectly (e.g., through core network 115), with one another over backhaul links 125 (e.g., X2, etc.), which may be wired or wireless communication links.

The base stations 105 may wirelessly communicate with the UEs 110 via one or more base station antennas. Each of the base stations 105 may provide communication coverage for a respective geographic coverage area 130. In some examples, the base stations 105 may be referred to as a base transceiver station, a radio base station, an access point, an access node, a radio transceiver, a NodeB, eNodeB (eNB), gNB, Home NodeB, a Home eNodeB, a relay, or some other suitable terminology. The geographic coverage area 130 for a base station 105 may be divided into sectors or cells making up only a portion of the coverage area (not shown). The wireless communication network 100 may include base stations 105 of different types (e.g., macro base stations or small cell base stations, described below). Additionally, the plurality of base stations 105 may operate according to different ones of a plurality of communication technologies (e.g., 5G (New Radio or "NR"), fourth generation (4G)/LTE, 3G, Wi-Fi, Bluetooth, etc.), and thus there may be overlapping geographic coverage areas 130 for different communication technologies.

In some examples, the wireless communication network 100 may be or include one or any combination of communication technologies, including a NR or 5G technology, a LTE or LTE-Advanced (LTE-A) or MuLTEfire technology, a Wi-Fi technology, a Bluetooth technology, or any other long or short range wireless communication technology. In LTE/LTE-A/MuLTEfire networks, the term evolved node B (eNB) may be generally used to describe the base stations 105, while the term UE may be generally used to describe the UEs 110. The wireless communication network 100 may be a heterogeneous technology network in which different types of eNBs provide coverage for various geographical regions. For example, each eNB or base station 105 may provide communication coverage for a macro cell, a small cell, or other types of cell. The term "cell" is a 3GPP term that can be used to describe a base station, a carrier or component carrier associated with a base station, or a coverage area (e.g., sector, etc.) of a carrier or base station, depending on context.

A macro cell may generally cover a relatively large geographic area (e.g., several kilometers in radius) and may allow unrestricted access by UEs 110 with service subscriptions with the network provider.

A small cell may include a relative lower transmit-powered base station, as compared with a macro cell, that may operate in the same or different frequency bands (e.g., licensed, unlicensed, etc.) as macro cells. Small cells may include pico cells, femto cells, and micro cells according to various examples. A pico cell, for example, may cover a small geographic area and may allow unrestricted access by UEs 110 with service subscriptions with the network provider. A femto cell may also cover a small geographic area (e.g., a home) and may provide restricted access and/or unrestricted access by UEs 110 having an association with the femto cell (e.g., in the restricted access case, UEs 110 in a closed subscriber group (CSG) of the base station 105, which may include UEs 110 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The communication networks that may accommodate some of the various disclosed examples may be packet-based networks that operate according to a layered protocol stack and data in the user plane may be based on the IP. A user plane protocol stack (e.g., packet data convergence protocol (PDCP), radio link control (RLC), MAC, etc.), may perform packet segmentation and reassembly to communicate over logical channels. For example, a MAC layer may perform priority handling and multiplexing of logical channels into transport channels. The MAC layer may also use hybrid automatic repeat/request (HARQ) to provide retransmission at the MAC layer to improve link efficiency. In the control plane, the RRC protocol layer may provide establishment, configuration, and maintenance of an RRC connection between a UE 110 and the base stations 105. The RRC protocol layer may also be used for core network 115 support of radio bearers for the user plane data. At the physical (PHY) layer, the transport channels may be mapped to physical channels.

The UEs 110 may be dispersed throughout the wireless communication network 100, and each UE 110 may be stationary or mobile. A UE 110 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 110 may be a cellular phone, a smart phone, a personal digital assistant (PDA), a wireless modem, a wireless communication device, a handheld device, a tablet computer, a laptop computer, a cordless phone, a smart watch, a wireless local loop (WLL) station, an entertainment device, a vehicular component, a customer premises equipment (CPE), or any device capable of communicating in wireless communication network 100. Additionally, a UE 110 may be Internet of Things (IoT) and/or machine-to-machine (M2M) type of device, e.g., a low power, low data rate (relative to a wireless phone, for example) type of device, that may in some aspects communicate infrequently with wireless communication network 100 or other UEs. A UE 110 may be able to communicate with various types of base stations 105 and network equipment including macro eNBs, small cell eNBs, macro gNBs, small cell gNBs, relay base stations, and the like.

UE 110 may be configured to establish one or more wireless communication links 135 with one or more base stations 105. The wireless communication links 135 shown in wireless communication network 100 may carry UL transmissions from a UE 110 to a base station 105, or DL transmissions, from a base station 105 to a UE 110. The downlink transmissions may also be called forward link transmissions while the uplink transmissions may also be called reverse link transmissions. Each wireless communication link 135 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. In an aspect, the wireless communication links 135 may transmit bidirectional communications using FDD (e.g., using paired spectrum resources) or time division duplex TDD operation (e.g., using unpaired spectrum resources). Frame structures may be defined for FDD (e.g., frame structure type 1) and TDD (e.g., frame structure type 2). Moreover, in some aspects, the wireless communication links 135 may represent one or more broadcast channels.

In some aspects of the wireless communication network 100, base stations 105 or UEs 110 may include multiple antennas for employing antenna diversity schemes to improve communication quality and reliability between base stations 105 and UEs 110. Additionally or alternatively, base stations 105 or UEs 110 may employ MIMO techniques that may take advantage of multi-path environments to transmit multiple spatial layers carrying the same or different coded data.

Wireless communication network 100 may support operation on multiple cells or carriers, such as carrier aggregation or multi-carrier operation. The terms "carrier," "component carrier," "cell," and "channel" may be used interchangeably herein. A UE 110 may be configured with multiple downlink CCs and one or more uplink CCs for carrier aggregation. Carrier aggregation may be used with both FDD and TDD component carriers. The base stations 105 and UEs 110 may use spectrum up to Y MHz (e.g., Y=5, 10, 15, or 20 MHz) bandwidth per carrier allocated in a carrier aggregation of up to a total of Yx MHz (x=number of component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications network 100 may further include base stations 105 operating according to Wi-Fi technology, e.g., Wi-Fi access points, in communication with UEs 110 operating according to Wi-Fi technology, e.g., Wi-Fi stations (STAs) via communication links in an unlicensed frequency spectrum (e.g., 5 GHz). When communicating in an unlicensed frequency spectrum, the STAs and AP may perform a clear channel assessment (CCA) or listen before talk (LBT) procedure prior to communicating in order to determine whether the channel is available.

Additionally, one or more of base stations 105 and/or UEs 110 may operate according to a NR or 5G technology referred to as millimeter wave (mmW or mmwave) technology. For example, mmW technology includes transmissions in mmW frequencies and/or near mmW frequencies. Extremely high frequency (EHF) is part of the radio frequency (RF) in the electromagnetic spectrum. EHF has a range of 30 GHz to 300 GHz and a wavelength between 1 millimeter and 10 millimeters. Radio waves in this band may be referred to as a millimeter wave. Near mmW may extend down to a frequency of 3 GHz with a wavelength of 100 millimeters. For example, the super high frequency (SHF) band extends between 3 GHz and 30 GHz, and may also be referred to as centimeter wave. Communications using the mmW and/or near mmW radio frequency band has extremely high path loss and a short range. As such, base stations 105 and/or UEs 110 operating according to the mmW technology may utilize beamforming in their transmissions to compensate for the extremely high path loss and short range.

Figure 2:
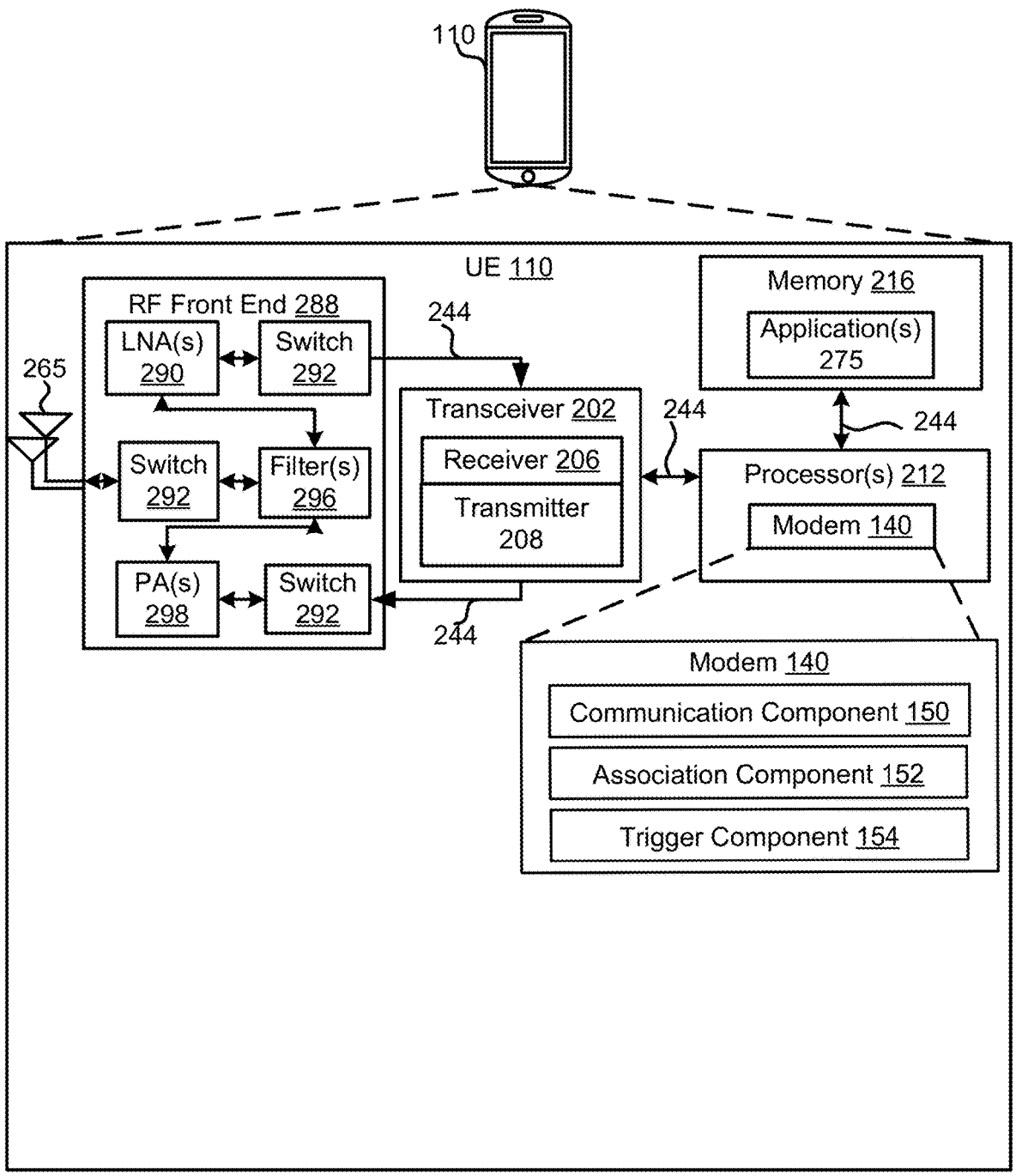
FIG. 2 is a schematic diagram of an example of a device, such as a user equipment.

Referring to FIG. 2, one example of an implementation of the UE 110 may include a variety of components, some of which have already been described above, but including components such as one or more processors 212 and memory 216 and transceiver 202 in communication via one or more buses 244, which may operate in conjunction with the modem 140, the communication component 150, the association component 152, and the trigger component 154 to enable one or more of the functions described herein related to communicating with the BS 105. Further, the one or more processors 212, modem 140, memory 216, transceiver 202, RF front end 288 and one or more antennas 265, may be configured to support voice and/or data calls (simultaneously or non-simultaneously) in one or more radio access technologies.

In an aspect, the one or more processors 212 can include the modem 140 that uses one or more modem processors. The various functions related to the communication component 150, the association component 152, and the trigger component 154 may be included in the modem 140 and/or processors 212 and, in an aspect, can be executed by a single processor, while in other aspects, different ones of the functions may be executed by a combination of two or more different processors. For example, in an aspect, the one or more processors 212 may include any one or any combination of a modem processor, or a baseband processor, or a digital signal processor, or a transmit processor, or a receiver processor, or a transceiver processor associated with transceiver 202. Additionally, the modem 140 may configure the UE 110 along with the association component 152 and the processors 212. In other aspects, some of the features of the one or more processors 212 and/or the modem 140 associated with the communication component 150 may be performed by transceiver 202.

Also, memory 216 may be configured to store data used herein and/or local versions of applications 275 or the communication component 150 and/or one or more subcomponents of the communication component 150 being executed by at least one processor 212. Memory 216 can include any type of computer-readable medium usable by a computer or at least one processor 212, such as random access memory (RAM), read only memory (ROM), tapes, magnetic discs, optical discs, volatile memory, non-volatile memory, and any combination thereof. In an aspect, for example, memory 216 may be a non-transitory computer-readable storage medium that stores one or more computer-executable codes defining the communication component 150 and/or one or more of its subcomponents, and/or data associated therewith, when UE 110 is operating at least one processor 212 to execute the communication component 150, the association component 152, and the trigger component 154 and/or one or more of their subcomponents.

Transceiver 202 may include at least one receiver 206 and at least one transmitter 208. Receiver 206 may include hardware, firmware, and/or software code executable by a processor for receiving data, the code comprising instructions and being stored in a memory (e.g., computer-readable medium). Receiver 206 may be, for example, a radio frequency (RF) receiver. In an aspect, receiver 206 may receive signals transmitted by at least one base station 105. Transmitter 208 may include hardware, firmware, and/or software code executable by a processor for transmitting data, the code comprising instructions and being stored in a memory (e.g., computer-readable medium). A suitable example of transmitter 208 may including, but is not limited to, an RF transmitter.

Moreover, in an aspect, UE 110 may include RF front end 288, which may operate in communication with one or more antennas 265 and transceiver 202 for receiving and transmitting radio transmissions, for example, wireless communications transmitted by at least one base station 105 or wireless transmissions transmitted by UE 110. RF front end 288 may be coupled with one or more antennas 265 and can include one or more low-noise amplifiers (LNAs) 290, one or more switches 292, one or more power amplifiers (PAs) 298, and one or more filters 296 for transmitting and receiving RF signals.

In an aspect, LNA 290 can amplify a received signal at a desired output level. In an aspect, each LNA 290 may have a specified minimum and maximum gain values. In an aspect, RF front end 288 may use one or more switches 292 to select a particular LNA 290 and the specified gain value based on a desired gain value for a particular application.

Further, for example, one or more PA(s) 298 may be used by RF front end 288 to amplify a signal for an RF output at a desired output power level. In an aspect, each PA 298 may have specified minimum and maximum gain values. In an aspect, RF front end 288 may use one or more switches 292 to select a particular PA 298 and the specified gain value based on a desired gain value for a particular application.

Also, for example, one or more filters 296 can be used by RF front end 288 to filter a received signal to obtain an input RF signal. Similarly, in an aspect, for example, a respective filter 296 can be used to filter an output from a respective PA 298 to produce an output signal for transmission. In an aspect, each filter 296 can be coupled with a specific LNA 290 and/or PA 298. In an aspect, RF front end 788 can use one or more switches 292 to select a transmit or receive path using a specified filter 296, LNA 290, and/or PA 298, based on a configuration as specified by transceiver 202 and/or processor 212.

As such, transceiver 202 may be configured to transmit and receive wireless signals through one or more antennas 265 via RF front end 288. In an aspect, transceiver may be tuned to operate at specified frequencies such that UE 110 can communicate with, for example, one or more base stations 105 or one or more cells associated with one or more base stations 105. In an aspect, for example, the modem 140 can configure transceiver 202 to operate at a specified frequency and power level based on the UE configuration of the UE 110 and the communication protocol used by the modem 140.

In an aspect, the modem 140 can be a multiband-multimode modem, which can process digital data and communicate with transceiver 202 such that the digital data is sent and received using transceiver 202. In an aspect, the modem 140 can be multiband and be configured to support multiple frequency bands for a specific communications protocol. In an aspect, the modem 140 can be multimode and be configured to support multiple operating networks and communications protocols. In an aspect, the modem 140 can control one or more components of UE 110 (e.g., RF front end 288, transceiver 202) to enable transmission and/or reception of signals from the network based on a specified modem configuration. In an aspect, the modem configuration can be based on the mode of the modem and the frequency band in use. In another aspect, the modem configuration can be based on UE configuration information associated with UE 110 as provided by the network during cell selection and/or cell reselection.

Figure 3:
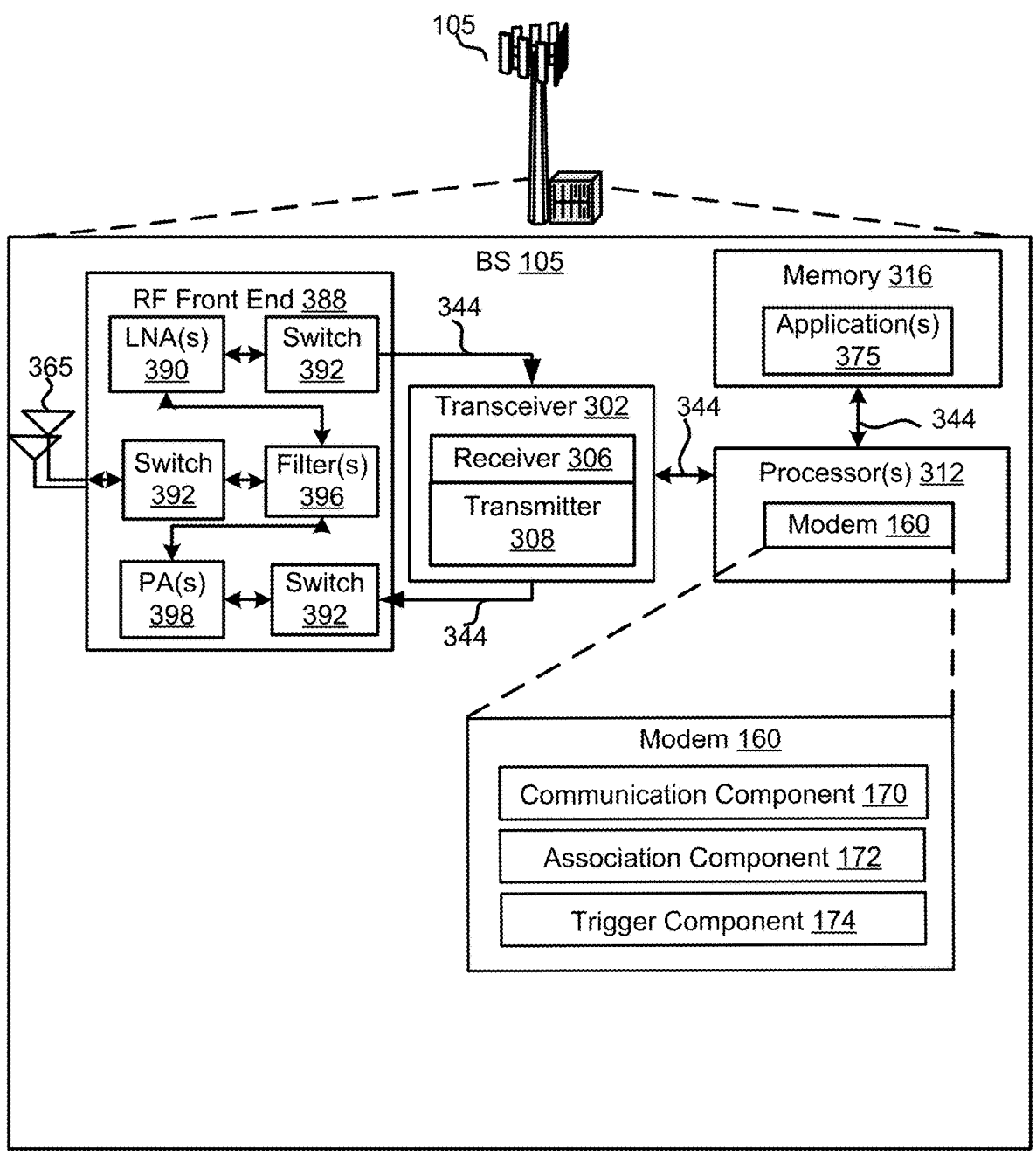
FIG. 3 is a schematic diagram of another example of a device, such as a base station.

Referring to FIG. 3, one example of an implementation of base station 105 may include a variety of components, some of which have already been described above, but including components such as one or more processors 312 and memory 316 and transceiver 302 in communication via one or more buses 344, which may operate in conjunction with the modem 160, the communication component 170, the association component 172, and the trigger component 174 to enable one or more of the functions described herein. The transceiver 302, receiver 306, transmitter 308, one or more processors 312, memory 316, applications 375, buses 344, RF front end 388, LNAs 390, switches 392, filters 396, PAs 398, and one or more antennas 365 may be the same as or similar to the corresponding components of the UE 110, as described above, but configured or otherwise programmed for base station operations as opposed to UE operations. For example, the communication component 170 may perform the communication procedure with the modem 160 and the processors 312.

Figure 4:
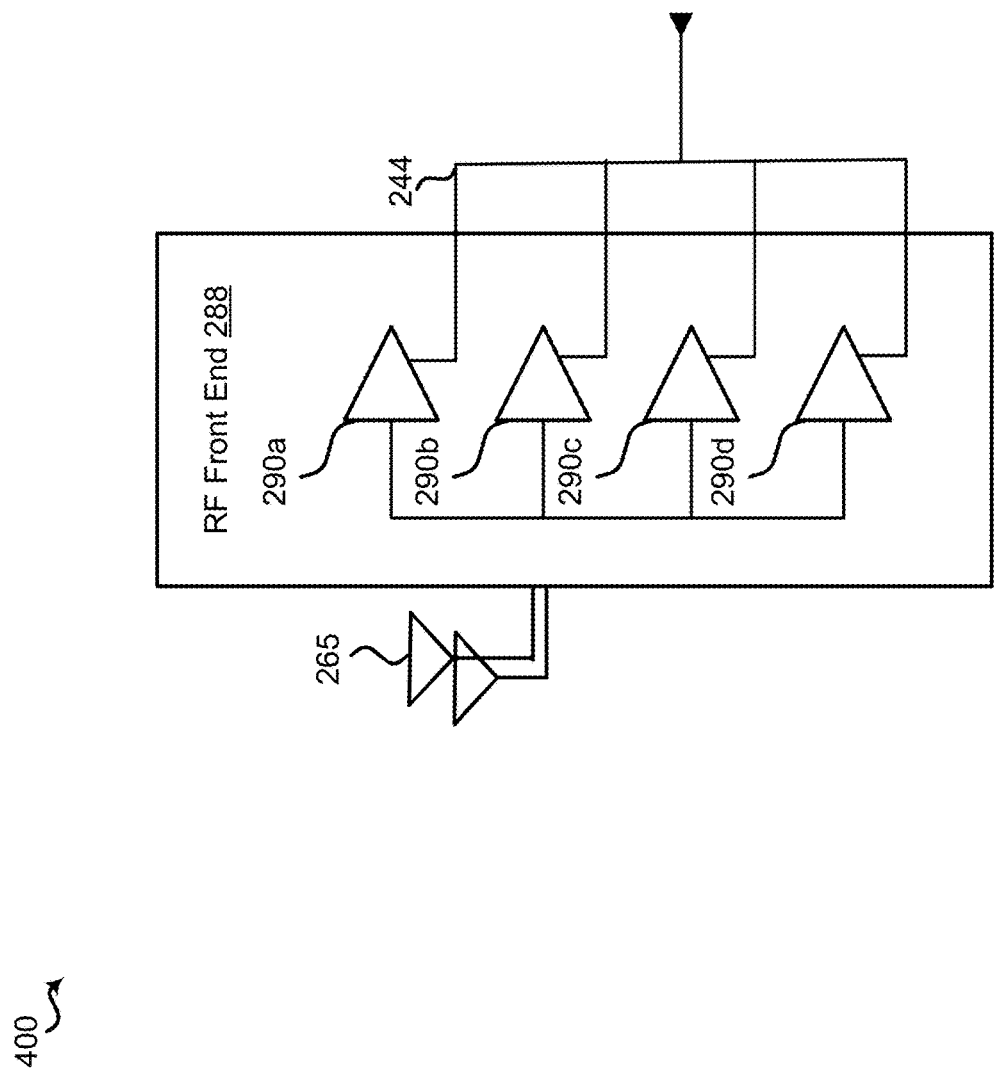
FIG. 4 is a schematic diagram of an example of the RF front end during a receiving operation.

Referring to FIG. 4, a schematic diagram 400 shows an example of the RF front end 288 during a reception operation. As aggregated data signals are received at the one or more antennas 265, the LNAs 290 of the RF front end 288 may amplify the received aggregated data signals by certain factors. The ratio of the received aggregated data signals and the amplified signals may be the gain of the LNAs 290. For example, the LNA 290a may amplify the data signals from the first component carrier by a factor of 100 (i.e. gain=100). The LNA 290b may amplify the data signals from the second component carrier by a factor of 50 (i.e. gain=50). The LNA 290c may amplify the data signals from the third component carrier by a factor of 60 (i.e. gain=60). The LNA 290d may amplify the data signals from the fourth component carrier by a factor of 10 (i.e. gain=10). In general, the gain of the LNAs 290 may range from 2 to 200, 5 to 150, or 10 to 100. For example, the gain of the LNAs 290 may be 10, 20, 30, 50, 100, 120, 130, 150, and 200.

In some implementations, the device may adjust the gain states of the LNAs 290a-d to different values via the bus 244. The gain states of the LNAs 290a-d may include the electrical power supplied to the LNAs 290a-d and other operational details of the LNAs 290a-d to adjust the gains, such as the duty cycle. For example, the device may adjust the gain state of the LNA 290a so the gain equals to 45, the gain state of the LNA 290b so the gain equals to 120, the gain state of the LNA 290c so the gain equals to 15, and the gain state of the LNA 290d so the gain equals to 80. The device may determine the gain states of the LNAs 290a-d to maximize the SINRs of the LNAs 290a-d. The gain states of the LNAs 290a-d may require one or more adjustments during the reception operation.

During the reception operation, the device may adjust the gain states of the LNAs 290a-d during buffer periods between symbols, such as during cyclic prefixes. In some implementations, the device may adjust the gain states of two or more LNAs 290a-d during the buffer periods if the buffer periods of the two or more component carriers substantially overlap. The two buffer periods may substantially overlap if more than 90 percent of the buffer periods overlap in time. Alternatively, the two buffer periods may substantially overlap if more than 50, 60, 70, 80, 90, 95, or 99 percent of the buffer periods overlap in time. In an example, the device may send a single signal to adjust the gain states of the LNA 290a and the LNA 290c. The buffer period of the first component carrier may overlap with the buffer period of the third component carrier by 10-100 percent, 20-90 percent, 30-80 percent, 40-70 percent, or 50-60 percent. After the adjustments, the gain of the LNA 290a may equal to 25 and the gain of the LNA 290c may equal to 125. The concurrent adjustments may allow the device to adjust the LNAs 290a-d more quickly. In some examples, the device may trigger a reconfigurable trigger signal after the buffer periods to adjust the gain states of two or more LNAs 290.

Figure 5:
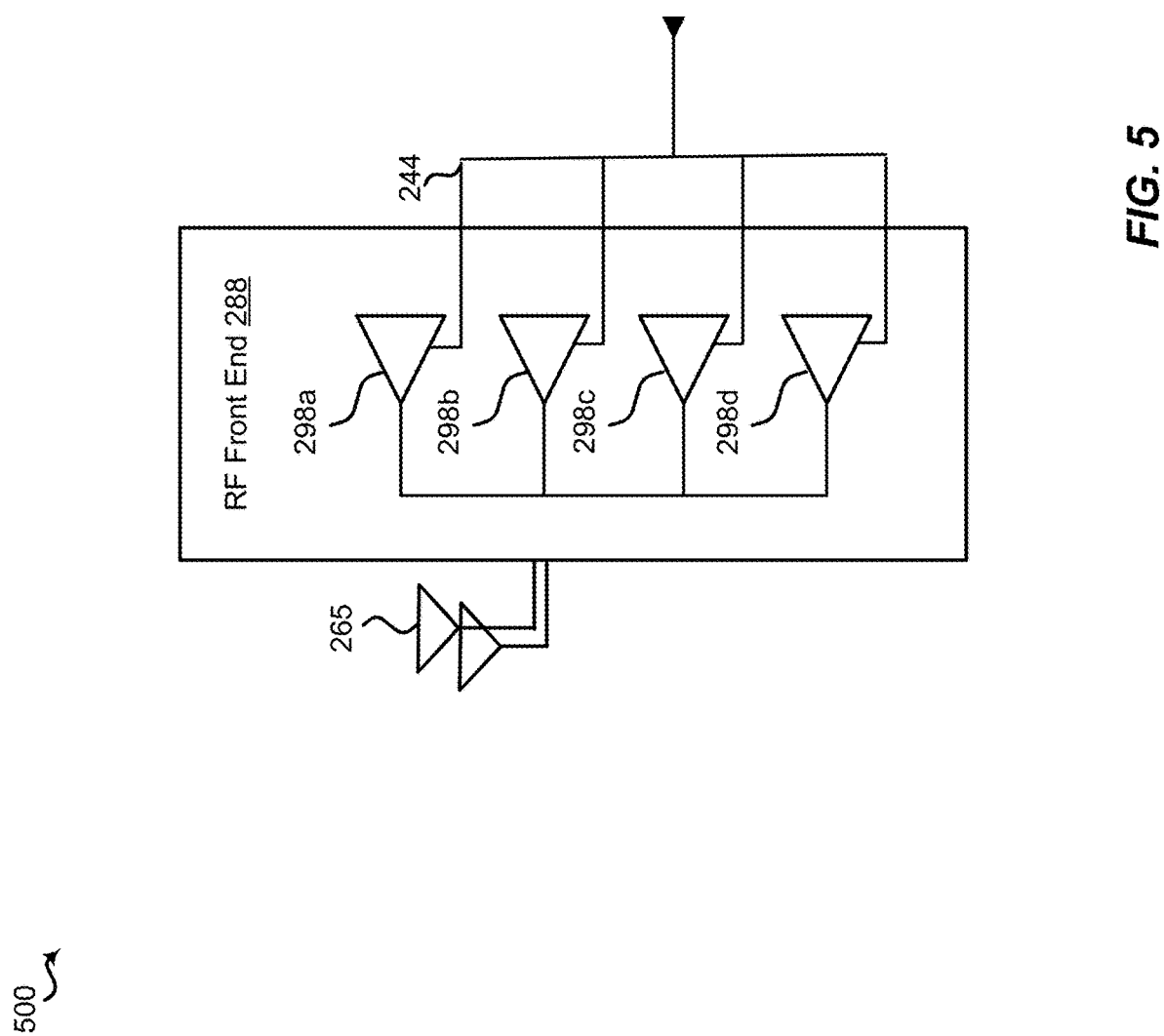
FIG. 5 is a schematic diagram of an example of the RF front end during a transmission operation.

Referring to FIG. 5, a schematic diagram 500 shows an example of the RF front end 288 during a transmission operation. As aggregated data signals are about to be transmitted at the one or more antennas 265, the PAs 298 of the RF front end 288 may amplify the transmission aggregated data signals by certain factors. The ratio of the transmission aggregated data signals and the amplified signals may be the gain of the PAs 298. For example, the PA 298a may amplify the data signals from the first component carrier by a factor of 200 (i.e. gain=200). The PA 298b may amplify the data signals from the second component carrier by a factor of 150 (i.e. gain=150). The PA 298c may amplify the data signals from the third component carrier by a factor of 45 (i.e. gain=45). The PA 298d may amplify the data signals from the fourth component carrier by a factor of 80 (i.e. gain=80). In general, the gain of the PAs 298a-d may range from 2 to 200, 5 to 150, or 10 to 100. For example, the gain of the PAs 298a-d may be 10, 20, 30, 50, 100, 120, 130, 150, and 200.

In some implementations, the device may adjust the gain states of the PAs 298a-d to different values via the bus 244. The gain states of the PAs 298a-d may include the electrical power supplied to the PAs 298a-d and other operational details of the PAs 298a-d to adjust the gains. For example, the device may adjust the gain state of the PA 298a so the gain equals to 25, the gain state of the PA 298b so the gain equals to 1520, the gain state of the PA 298c so the gain equals to 75, and the gain state of the PA 298d so the gain equals to 5. The device may determine the gain states of the PAs 298a-d to maximize the SINRs of the PAs 298a-d. The gain states of the PAs 298a-d may require one or more adjustments during the transmission operation.

During the transmission operation, the device may adjust the gain states of the PAs 298a-d during buffer periods between symbols, such as during cyclic prefixes. In some implementations, the device may adjust the gain states of two or more PAs 298a-d during the buffer periods if the buffer periods of the two or more component carriers substantially overlap. The two buffer periods may substantially overlap if more than 90 percent of the buffer periods overlap in time. Alternatively, the two buffer periods may substantially overlap if more than 50, 60, 70, 80, 90, 95, or 99 percent of the buffer periods overlap in time. In an example, the device may send a single signal to adjust the gain states of the PA 298b and the PA 298d. The buffer period of the second component carrier may overlap with the buffer period of the fourth component carrier by 10-100 percent, 20-90 percent, 30-80 percent, 40-70 percent, or 50-60 percent. After the adjustments, the gain of the PA 298b may equal to 95 and the gain of the PA 298d may equal to 125. The concurrent adjustments may allow the device to adjust the PAs 298a-d more quickly. In some examples, the device may trigger a reconfigurable trigger signal after the buffer periods to adjust the gain states of two or more PAs 298a-d.

Figure 6:
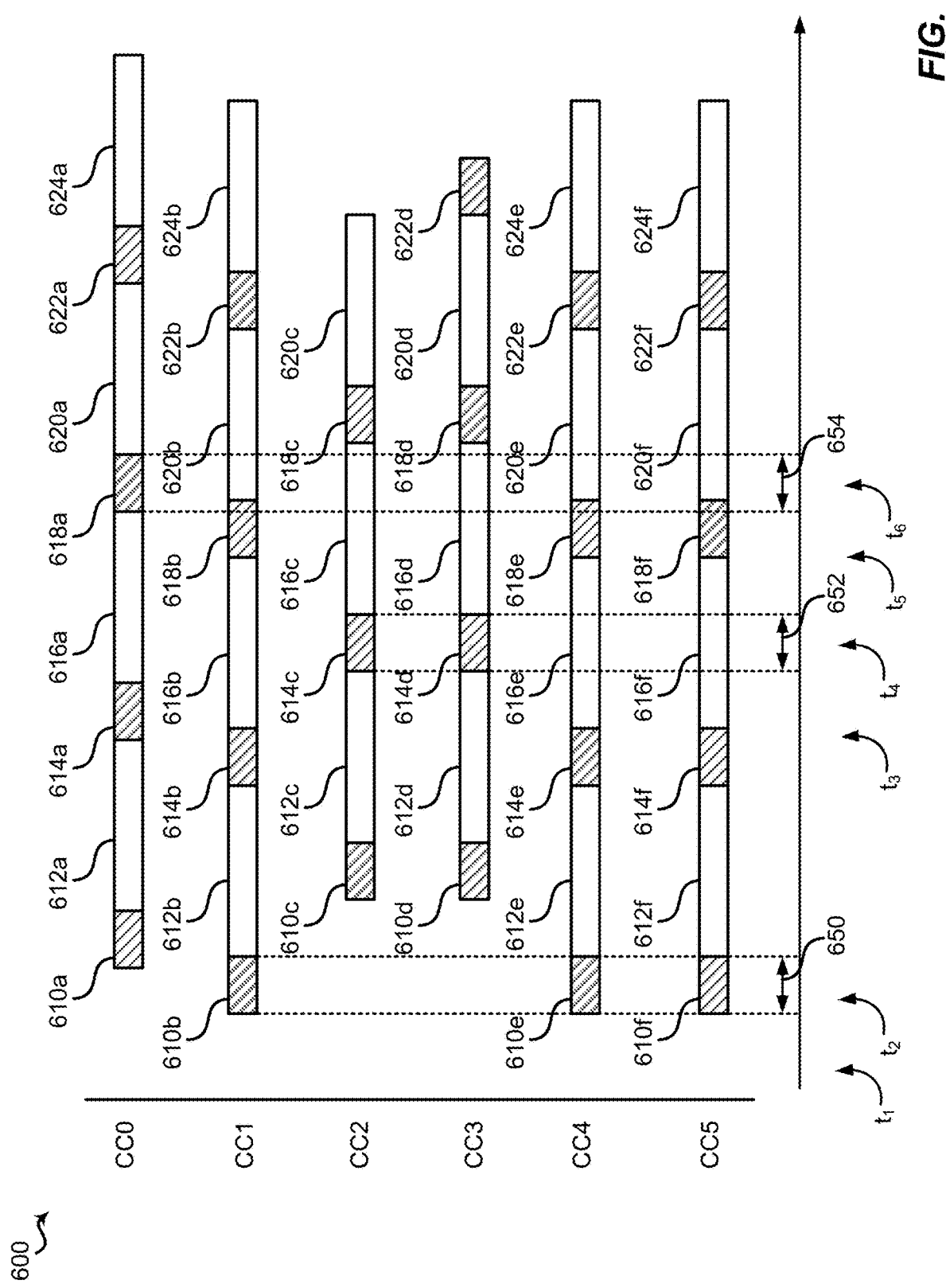
FIG. 6 is an example of a timing diagram illustrating dynamically assigning triggers to different component carriers.

Referring to FIG. 6, a timing diagram 600 shows an example of dynamically assigning triggers to different component carriers. In some implementations, a device, such as the BS 105 or the UE 110 described in FIGS. 1-3, may aggregate six component carriers CC0, CC1, CC2, CC3, CC4, and CC5 for DL operations. One or more LNAs may be associated with each component carrier CC0, CC1, CC2, CC3, CC4, and CC5. CC0 may receive a CC0 symbol-1 612a, a CC0 symbol-2 616a, a CC0 symbol-3 620a, and a CC0 symbol-4 624a. A CC0 buffer period-1 610a may be in front of the CC0 symbol-1 612a. A CC0 buffer period-2 614a may be between the CC0 symbol-1 612a and the CC0 symbol-2 616a. A CC0 buffer period-3 618a may be between the CC0 symbol-2 616a and the CC0 symbol-3 620a. A CC0 buffer period-4 622a may be between the CC0 symbol-3 620a and the CC0 symbol-4 624a. CC1 may receive a CC1 symbol 1 612b, a CC1 symbol-2 616b, a CC1 symbol-3 620b, and a CC1 symbol-4 624b. A CC1 buffer period-1 610b may be in front of the CC1 symbol-1 612b. A CC1 buffer period-2 614b may be between the CC1 symbol-1 612b and the CC1 symbol-2 616b. A CC1 buffer period-3 618b may be between the CC1 symbol-2 616b and the CC1 symbol-3 620b. A CC1 buffer period-4 622b may be between the CC1 symbol-3 620b and the CC1 symbol-4 624b. CC2 may receive a CC2 symbol-1 612c, a CC2 symbol-2 616c, and a CC2 symbol-3 620c. A CC2 buffer period-1 610c may be in front of the CC2 symbol-1 612c. A CC2 buffer period-2 614c may be between the CC2 symbol-1 612c and the CC2 symbol-2 616c. A CC2 buffer period-3 618c may be between the CC2 symbol-2 616c and the CC2 symbol-3 620c.

Still referring to FIG. 6, CC3 may receive a CC3 symbol-1 612d, a CC3 symbol-2 616d, and a CC3 symbol-3 620d. A CC3 buffer period-1 610d may be in front of the CC3 symbol-1 612d. A CC3 buffer period-2 614d may be between the CC3 symbol-1 612d and the CC3 symbol-2 616d. A CC3 buffer period-3 618d may be between the CC3 symbol-2 616d and the CC3 symbol-3 620d. A CC3 buffer period-4 622d may be after the CC3 symbol-3 620d. CC4 may receive a CC4 symbol-1 612e, a CC4 symbol-2 616e, a CC4 symbol-3 620e, and a CC4 symbol-4 624e. A CC4 buffer period-1 610e may be in front of the CC4 symbol-1 612e. A CC4 buffer period-2 614e may be between the CC4 symbol-1 612e and the CC4 symbol-2 616e. A CC4 buffer period-3 618e may be between the CC4 symbol-2 616e and the CC4 symbol-3 620e. A CC4 buffer period-4 622e may be between the CC4 symbol-3 620e and the CC4 symbol-4 624e. CC5 may receive a CC5 symbol-1 612f, a CC5 symbol-2 616f, a CC5 symbol-3 620f, and a CC1 symbol-4 624f. A CC5 buffer period-1 610f may be in front of the CC5 symbol-1 612f. A CC5 buffer period-2 614f may be between the CC5 symbol-1 612f and the CC5 symbol-2 616f. A CC5 buffer period-3 618f may be between the CC5 symbol-2 616f and the CC5 symbol-3 620f. A CC5 buffer period-4 622f may be between the CC5 symbol-3 620f and the CC5 symbol-4 624f.

Still referring to FIG. 6, the CC1 buffer period-1 610b, the CC4 buffer period-1 610e, and the CC5 buffer period-1 610f may substantially overlap in time. The CC2 buffer period-2 614c and the CC3 buffer period-2 614d may substantially overlap in time. In some implementations, device may adjust the LNAs associated with the component carriers CC0, CC1, CC2, CC3, CC4, and CC5 during the buffer periods 610, 614, 618, 622. At a time $t_1$, the device may assign trigger-0 to CC1, CC4, and CC5 because the CC1 buffer period-1 610b, the CC4 buffer period-1 610e, and the CC5 buffer period-1 610f substantially overlap in time. The time $t_1$ may occur before a first time interval 650. The device may rely on Trigger-0 to set the gain states of the LNAs associated with CC1, CC4, and CC5. At a time $t_2$, the device may trigger Trigger-0 to concurrently adjust the gain states of the LNAs associated with CC1, CC4, and CC5 during the CC1 buffer period-1 610b (equivalently the CC4 buffer period-1 610e or the CC5 buffer period-1 610f). The time $t_2$ may fall within the first time interval 650. The LNAs associated with CC1, CC4, and CC5 may be set to the same or different gain states. Next, at a time $t_3$, the device may assign Trigger-1 to CC2 and CC3 because the CC2 buffer period-2 614c and the CC3 buffer period-2 614d substantially overlap in time. The time $t_3$ may occur before a second time interval 652. The device may rely on Trigger-1 to concurrently adjust the gain states of the LNAs associated with CC2 and CC3. At a time $t_4$, the device may trigger Trigger-1 to set the gain states of the LNAs associated with CC2 and CC3 during the CC2 buffer period-2 614c (equivalently the CC3 buffer period-2 614d). The time $t_4$ may fall within the second time interval 652. Next, at a time $t_5$, the device may assign Trigger-2 to CC0. The time $t_5$ may occur before a third time interval 654. At a time $t_6$, the device may trigger Trigger-2 to adjust the gain states of the LNAs associated with CC0 during the CC0 buffer period-3 618a. The time $t_6$ may fall within the third time interval 654.

Figure 7:
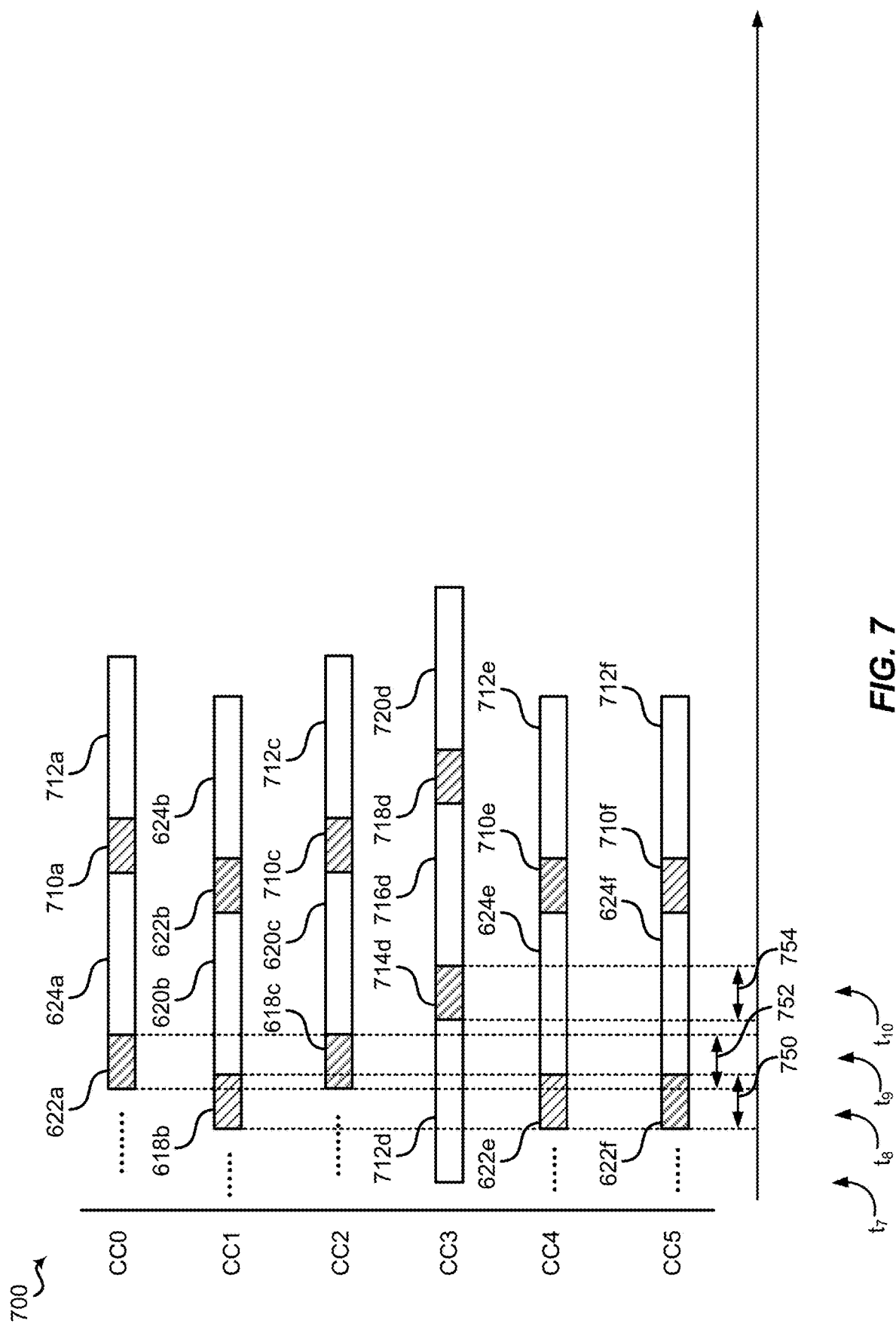
FIG. 7 is another example of a timing diagram illustrating dynamically assigning triggers to different component carriers.

Turning now to FIG. 7, a timing diagram 700 shows another example of dynamically assigning triggers to different component carriers. In some examples, CC0 may receive a CC0 symbol-5 712a. A CC0 buffer period-5 710a may be between the CC0 symbol-4 624a and the CC0 symbol-5 712a. CC2 may receive a CC2 symbol-4 712c. A CC2 buffer period-4 710c may be between the CC2 symbol-3 620c and the CC2 symbol-4 712c. CC3 may receive a CC3 symbol-4 712d, a CC3 symbol-5 716d, and a CC3 symbol-6 720d. A CC3 buffer period-5 714d may be between the CC3 symbol-4 712d and the CC3 symbol-5 716d. A CC3 buffer period-6 718d may be between the CC3 symbol-5 716d and the CC3 symbol-6 720d. CC4 may receive a CC4 symbol-5 712e. A CC4 buffer period-5 710e may be between the CC4 symbol-4 624e and the CC4 symbol-5 712e. CC5 may receive a CC5 symbol-5 712f. A CC5 buffer period-5 710f may be between the CC5 symbol-4 624f and the CC5 symbol-5 712f. In certain implementations, the timing of the component carriers CC0, CC1, CC2, CC3, CC4, and CC5 may change after the time $t_6$. Consequently, the device may dynamically assign some of the triggers Trigger-0, Trigger-1, and/or Trigger-2 to different component carriers CC0, CC1, CC2, CC3, CC4, and/or CC5. For example, at a time $t_7$, the device may dynamically assign Trigger-2 to CC2 because the CC0 buffer period-4 622a substantially overlaps with the CC2 buffer period-3 618c. The time $t_7$ may occur before a fourth time interval 750. At a time $t_8$s, the device may trigger Trigger-0 to concurrently readjust the gain states of the LNAs associated with CC1, CC4, and CC5 during the CC1 buffer period-3 618b (equivalently the CC4 buffer period-4 622e or the CC5 buffer period-4 622f). The time $t_8$ may fall within the fourth time interval 750. At a time $t_9$, the device may trigger Trigger-2 to concurrently readjust the gain states of the LNAs associated with CC0 and CC2 during the CC0 buffer period-4 622a (equivalently the CC2 buffer period-3 618c). The time $t_9$ may fall within a fifth time interval 752. At a time $t_{10}$, the device may trigger Trigger-1 to readjust the gain states of the LNAs associated with CC3 during the CC3 buffer period-5 714d. The time $t_{10}$ may fall within a sixth time interval 754. In certain implementations, the buffer periods may occur during the cyclic prefixes.

In some implementations, the dynamic assignment may be applicable during UL operations. The device may dynamically set the gain states of PAs.

In certain implementations, the device may detect the timing change of the component carriers. For example, the component carriers CC0, CC1, CC2, CC3, CC4, and CC5 may have experienced a timing change as illustrated in FIGS. 6 and 7. Specifically, as shown in FIG. 6, the CC1 buffer period-1 610b is temporally aligned with the CC4 buffer period-1 610e and the CC5 buffer period-1 610f, and the CC1 buffer period-3 618b is scheduled to be aligned with the CC4 buffer period-3 618e and the CC5 buffer period-31 618f. Similarly, the CC2 buffer period-2 614c is temporally aligned with the CC3 buffer period 2 614d, and the CC2 buffer period-3 618c is scheduled to be aligned with the CC3 buffer period-3 618d. In FIG. 7, however, a timing change has occurred among the component carriers CC0, CC1, CC2, CC3, CC4, and CC5. Consequently, the CC1 buffer period-3 618b is now temporally aligned with the CC4 buffer period-4 622e and the CC5 buffer period-4 622f The CC2 buffer period-3 618c is now temporally aligned with the CC0 buffer period-4 622a.

Figure 8:
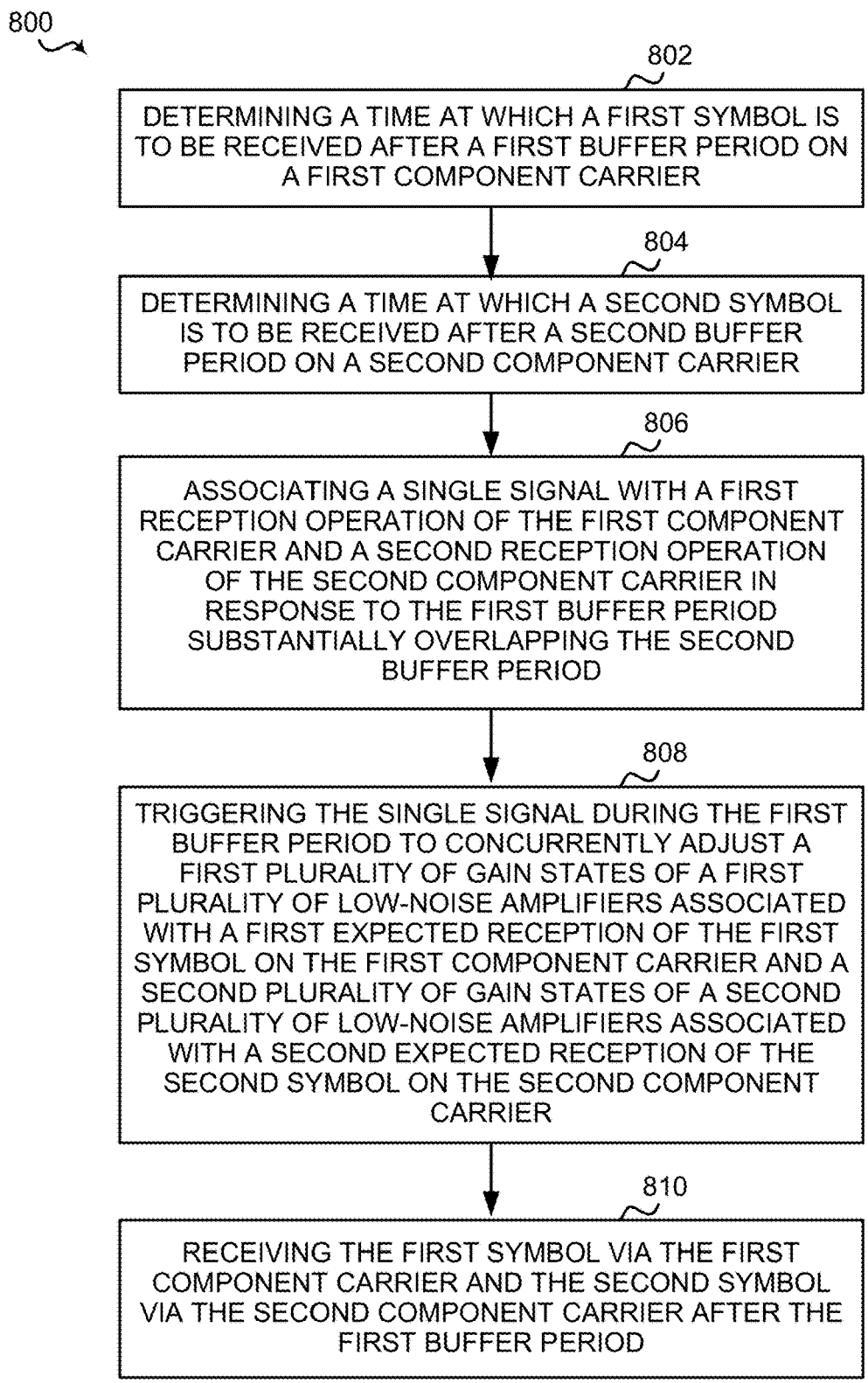
FIG. 8 is process flow diagram of an example of a method for performing dynamically assigning triggers during downlink.

Turning now to FIG. 8, the device, such as the UE 110 or the BS 105, may perform an example of a method 800 of wireless communications including dynamically assigning triggers to component carriers during DL operations.

At block 802, the method 800 may determine a first time at which a first symbol is to be received after a first buffer period on a first component carrier. For example, the communication component 150 of the device may determine a time at which the CC2 symbol-1 612c is to be received after the CC2 buffer period-1 610c on CC2.

At block 804, the method 800 may determine a second time at which a second symbol is to be received after a second buffer period on a second component carrier. For example, the communication component 150 of the device may determine a time at which the CC3 symbol-1 612d is to be received after the CC3 buffer period-1 610d on CC3, wherein the CC2 buffer period-1 610c and the CC3 buffer period-1 610d substantially overlap.

At block 806, the method 800 may associate a single signal with a first reception operation of the first component carrier and a second reception operation of the second component carrier in response to the first buffer period substantially overlapping the second buffer period. For example, the association component 152 may associate a reconfigurable trigger signal with the reception operations of CC2 and CC3.

At block 808, the method 800 may trigger the single signal during the first buffer period to concurrently adjust a first plurality of gain states of a first plurality of low-noise amplifiers associated with a first expected reception of the first symbol on the first component carrier and a second plurality of gain states of a second plurality of low-noise amplifiers associated with a second expected reception of the second symbol on the second component carrier. For example, the trigger component 154 of the device may transmit the reconfigurable trigger signal via the RFFE bus to adjust the gain states of the LNAs 290 associated with the receptions of the CC2 symbol-1 612c on CC2 and the CC3 symbol-1 612d on CC3.

At block 810, the method 800 may receive the first symbol via the first component carrier and the second symbol via the second component carrier after the first buffer period. For example, the communication component 150 may receive CC2 symbol-1 612c via CC2 and the CC3 symbol-1 612d via CC3 after the adjustment of the gain states of the LNAs 290 during the CC2 buffer period-1 610c.

Figure 9:
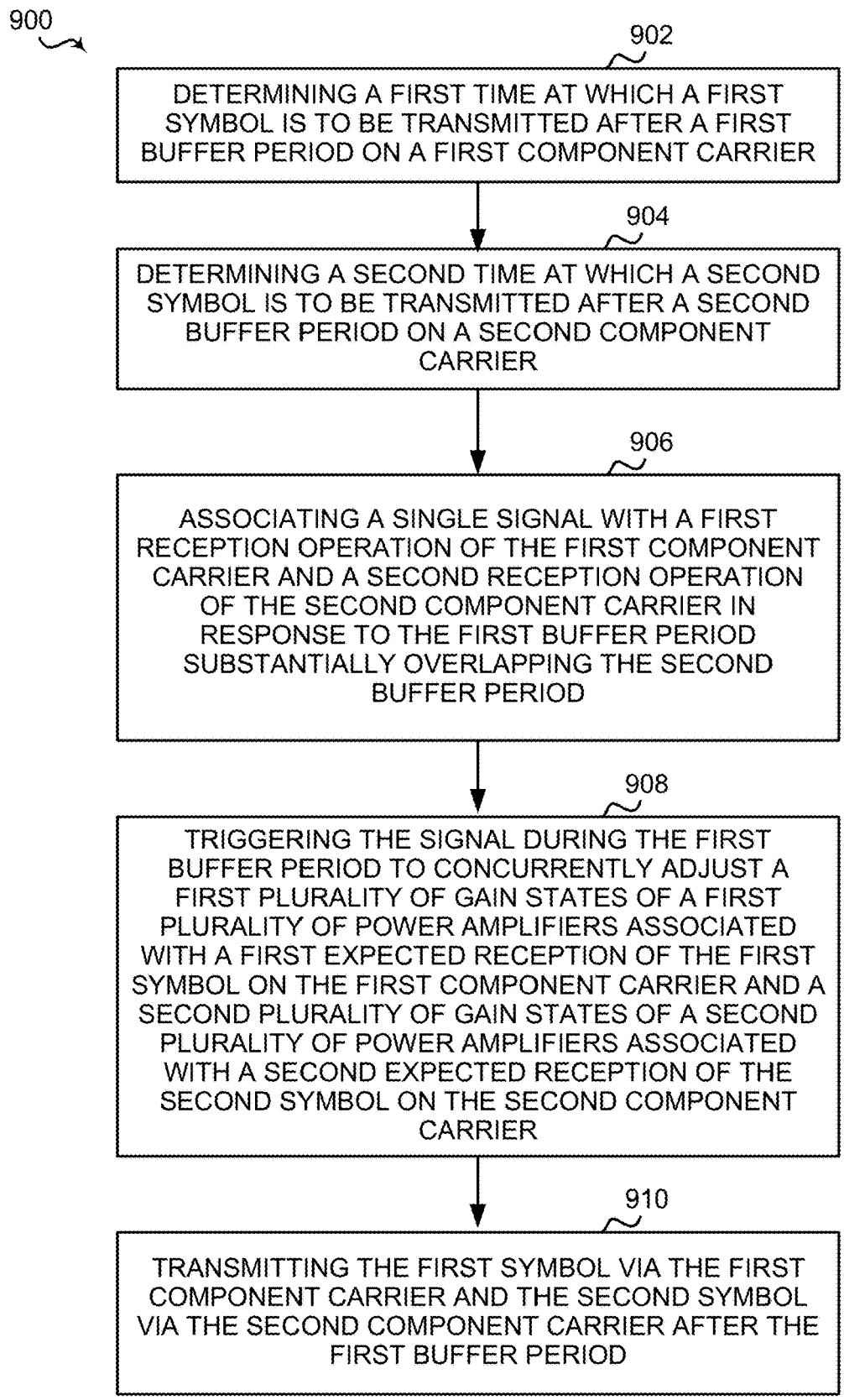
FIG. 9 is process flow diagram of an example of a method for performing dynamically assigning triggers during uplink.

Turning now to FIG. 9, the device, such as the UE 110 or the BS 105, may perform an example of a method 900 of wireless communications including dynamically assigning triggers to component carriers during UL operations.

At block 902, the method 900 may determine a first time at which a first symbol is to be transmitted after a first buffer period on a first component carrier. For example, the communication component 150 of the device may determine a first time at which a first symbol is to be transmitted after a first buffer period on a first component carrier.

At block 904, the method 900 may determine a second time at which a second symbol is to be transmitted after a second buffer period on a second component carrier. For example, the communication component 150 of the device may determine a second time at which a second symbol is to be transmitted after a second buffer period on a second component carrier.

At block 906, the method 900 may associate a single signal with a first reception operation of the first component carrier and a second reception operation of the second component carrier in response to the first buffer period substantially overlapping the second buffer period. For example, the association component 152 may associate a single signal with a first reception operation of the first component carrier and a second reception operation of the second component carrier in response to the first buffer period substantially overlapping the second buffer period.

At block 908, the method 900 may trigger the signal during the first buffer period to concurrently adjust a first plurality of gain states of a first plurality of power amplifiers associated with a first expected reception of the first symbol on the first component carrier and a second plurality of gain states of a second plurality of power amplifiers associated with a second expected reception of the second symbol on the second component carrier. For example, the trigger component 154 of the device may transmit the reconfigurable trigger signal via the RFFE bus to adjust the gain states of the PAs 298 associated with the first component carrier and the second component carrier.

At block 910, the method 900 may transmit the first symbol via the first component carrier and the second symbol via the second component carrier after the first buffer period. For example, the communication component 150 may transmit the first symbol via the first component carrier and the second symbol via the second component carrier after the adjustment of the gain states of the PAs 298 during the first buffer period.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. For example, changes may be made in the function and arrangement of elements discussed without departing from the scope of the disclosure. Also, various examples may omit, substitute, or add various procedures or components as appropriate. For instance, the methods described may be performed in an order different from that described, and various steps may be added, omitted, or combined. Also, features described with respect to some examples may be combined in other examples. In some instances, well-known structures and apparatuses are shown in block diagram form in order to avoid obscuring the concepts of the described examples.

It should be noted that the techniques described herein may be used for various wireless communication networks such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1X, 1X, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP LTE and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description herein, however, describes an LTE/LTE-A system or 5G system for purposes of example, and LTE terminology is used in much of the description below, although the techniques may be applicable other next generation communication systems.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A method of wireless communication, comprising:
   determining a first time at which a first symbol is to be received after a first buffer period on a first component carrier;
   determining a second time at which a second symbol is to be received after a second buffer period on a second component carrier;
   associating a single signal with a first reception operation of the first component carrier and a second reception operation of the second component carrier in response to the first buffer period substantially overlapping the second buffer period;
   triggering the single signal during the first buffer period to concurrently adjust a first plurality of gain states of a first plurality of low-noise amplifiers associated with a first expected reception of the first symbol on the first component carrier and a second plurality of gain states of a second plurality of low-noise amplifiers associated with a second expected reception of the second symbol on the second component carrier; and
   receiving the first symbol via the first component carrier and the second symbol via the second component carrier after the first buffer period.

2. The method of claim 1, wherein triggering the single signal further includes communicating the single signal to the first plurality of low-noise amplifiers and the second plurality of low-noise amplifiers on a radio frequency front end bus.

3. The method of claim 1, wherein the single signal includes a radio-frequency front end reconfigurable trigger signal.

4. The method of claim 1, wherein the first component carrier includes a first plurality of diversity paths and the second component carrier includes a second plurality of diversity paths.

5. The method of claim 4, wherein each diversity path includes one or more low-noise amplifiers from the first plurality of low-noise amplifiers or the second plurality of low-noise amplifiers.

6. The method of claim 1, further comprising detecting, after receiving the first symbol and the second symbol, a timing difference between the first component carrier and the second component carrier, wherein the timing difference indicates that a first subsequent buffer period of the first component carrier does not substantially overlap with a second subsequent buffer period of the second component carrier.

7. The method of claim 6, further comprising:
   determining a third time at which a third symbol is to be received after a third buffer period on a first component carrier;
   determining a fourth time at which a fourth symbol is to be received after a fourth buffer period on a third component carrier, the third component carrier being associated with a single second signal;
   associating the second single signal with the first reception operation of the first component carrier in response to the third buffer period substantially overlapping the fourth buffer period;
   triggering the second signal during the third buffer period to concurrently adjust the first plurality of gain states of the first plurality of low-noise amplifiers associated with a third expected reception of the third symbol on the first component carrier and a third plurality of gain states of a third plurality of low-noise amplifiers associated with a fourth expected reception of the fourth symbol on the third component carrier; and
   receiving the third symbol via the first component carrier and the fourth symbol via the third component carrier after the third buffer period.

8. A device for wireless communications, comprising
   a memory;
   a transceiver; and
   one or more processors operatively coupled to the memory and the transceiver, the one or more processors being configured to:
      determine a first time at which a first symbol is to be received after a first buffer period on a first component carrier;
      determine a second time at which a second symbol is to be received after a second buffer period on a second component carrier;
      associate a single signal with a first reception operation of the first component carrier and a second reception operation of the second component carrier in response to the first buffer period substantially overlapping the second buffer period;

trigger the single signal during the first buffer period to concurrently adjust a first plurality of gain states of a first plurality of low-noise amplifiers associated with a first expected reception of the first symbol on the first component carrier and a second plurality of gain states of a second plurality of low-noise amplifiers associated with a second expected reception of the second symbol on the second component carrier; and receive, via the transceiver, the first symbol via the first component carrier and the second symbol via the second component carrier after the first buffer period.

9. The device of claim 8, wherein triggering the single signal further includes communicating the single signal to the first plurality of low-noise amplifiers and the second plurality of low-noise amplifiers on a radio frequency front end bus.

10. The device of claim 8, wherein the single signal includes a radio-frequency front end reconfigurable trigger signal.

11. The device of claim 8, wherein the first component carrier includes a first plurality of diversity paths and the second component carrier includes a second plurality of diversity paths.

12. The device of claim 8, wherein each diversity path includes one or more low-noise amplifiers from the first plurality of low-noise amplifiers or the second plurality of low-noise amplifiers.

13. The device of claim 8, wherein the one or more processors are further configured to detect, after receiving the first symbol and the second symbol, a timing difference between the first component carrier and the second component carrier, wherein the timing difference indicates that a first subsequent buffer period of the first component carrier does not substantially overlap with a second subsequent buffer period of the second component carrier.

14. The device of claim 13, wherein the one or more processors are further configured to:
determine a third time at which a third symbol is to be received after a third buffer period on a first component carrier;
determine a fourth time at which a fourth symbol is to be received after a fourth buffer period on a third component carrier, the third component carrier being associated with a single second signal;
associate the second single signal with the first reception operation of the first component carrier in response to the third buffer period substantially overlapping the fourth buffer period;
trigger the second signal during the third buffer period to concurrently adjust the first plurality of gain states of the first plurality of low-noise amplifiers associated with a third expected reception of the third symbol on the first component carrier and a third plurality of gain states of a third plurality of low-noise amplifiers associated with a fourth expected reception of the fourth symbol on the third component carrier; and
receive, via the transceiver, the third symbol via the first component carrier and the fourth symbol via the third component carrier after the third buffer period.

15. The device of claim 8, wherein the device is a user equipment.

16. The device of claim 8, wherein the device is a base station.

17. A non-transitory computer-readable medium having instructions stored therein that, when executed by one or more processors of a local device, cause the one or more processors to:
determine a first time at which a first symbol is to be received after a first buffer period on a first component carrier;
determine a second time at which a second symbol is to be received after a second buffer period on a second component carrier;
associate a single signal with a first reception operation of the first component carrier and a second reception operation of the second component carrier in response to the first buffer period substantially overlapping the second buffer period;
trigger the single signal during the first buffer period to concurrently adjust a first plurality of gain states of a first plurality of low-noise amplifiers associated with a first expected reception of the first symbol on the first component carrier and a second plurality of gain states of a second plurality of low-noise amplifiers associated with a second expected reception of the second symbol on the second component carrier; and
receive the first symbol via the first component carrier and the second symbol via the second component carrier after the first buffer period.

18. The non-transitory computer-readable medium of claim 17, wherein triggering the single signal further includes communicating the single signal to the first plurality of low-noise amplifiers and the second plurality of low-noise amplifiers on a radio frequency front end bus.

19. The non-transitory computer-readable medium of claim 17, wherein the single signal includes a radio-frequency front end reconfigurable trigger signal.

20. The non-transitory computer-readable medium of claim 17, wherein the first component carrier includes a first plurality of diversity paths and the second component carrier includes a second plurality of diversity paths.

21. The non-transitory computer-readable medium of claim 17, wherein each diversity path includes one or more low-noise amplifiers from the first plurality of low-noise amplifiers or the second plurality of low-noise amplifiers.

22. The non-transitory computer-readable medium of claim 17, further comprising instructions that, when executed by the one or more processors of a local device, cause the one or more processors to detect, after receiving the first symbol and the second symbol, a timing difference between the first component carrier and the second component carrier, wherein the timing difference indicates that a first subsequent buffer period of the first component carrier does not substantially overlap with a second subsequent buffer period of the second component carrier.

23. The non-transitory computer-readable medium of claim 22, further comprising instructions that, when executed by the one or more processors, cause the one or more processors to:
determine a third time at which a third symbol is to be received after a third buffer period on a first component carrier;
determine a fourth time at which a fourth symbol is to be received after a fourth buffer period on a third component carrier, the third component carrier being associated with a single second signal;
associate the second single signal with the first reception operation of the first component carrier in response to the third buffer period substantially overlapping the fourth buffer period;

trigger the second signal during the third buffer period to concurrently adjust the first plurality of gain states of the first plurality of low-noise amplifiers associated with a third expected reception of the third symbol on the first component carrier and a third plurality of gain states of a third plurality of low-noise amplifiers associated with a fourth expected reception of the fourth symbol on the third component carrier; and receive the third symbol via the first component carrier and the fourth symbol via the third component carrier after the third buffer period.

24. A method of wireless communication, comprising:
determining a first time at which a first symbol is to be transmitted after a first buffer period on a first component carrier;
determining a second time at which a second symbol is to be transmitted after a second buffer period on a second component carrier;
associating a single signal with a first reception operation of the first component carrier and a second reception operation of the second component carrier in response to the first buffer period substantially overlapping the second buffer period;
triggering the signal during the first buffer period to concurrently adjust a first plurality of gain states of a first plurality of power amplifiers associated with a first expected reception of the first symbol on the first component carrier and a second plurality of gain states of a second plurality of power amplifiers associated with a second expected reception of the second symbol on the second component carrier; and
transmitting the first symbol via the first component carrier and the second symbol via the second component carrier after the first buffer period.

25. The method of claim 24, wherein triggering the single signal further includes transmitting the single signal on a radio frequency front end bus.

26. The method of claim 24, wherein the single signal includes a radio-frequency front end reconfigurable trigger signal.

27. The method of claim 24, wherein the first component carrier includes a first plurality of diversity paths and the second component carrier includes a second plurality of diversity paths.

28. The method of claim 24, wherein each diversity path includes one or more power amplifiers from the first plurality of power amplifiers or the second plurality of power amplifiers.

29. The method of claim 24, further comprising detecting, after transmitting the first symbol and the second symbol, a timing change of the first component carrier.

30. The method of claim 29, further comprising:
determine a third time at which a third symbol is to be transmitted after a third buffer period on a first component carrier;
determine a fourth time at which a fourth symbol is to be transmitted after a fourth buffer period on a third component carrier, the third component carrier being associated with a second single signal;
associating the second single signal with the reception operation first component carrier in response to the third buffer period substantially overlapping the fourth buffer period;
triggering the second single signal during the third buffer period to concurrently adjust the first plurality of gain states of the first plurality of power amplifiers associated with a third expected reception of the third symbol on the first component carrier and a third plurality of gain states of a third plurality of power amplifiers associated with a fourth expected reception of the fourth symbol on the third component carrier; and
transmitting the third symbol via the first component carrier and the fourth symbol via the third component carrier after the third buffer period.

* * * * *